(12) United States Patent
Yokoyama et al.

(10) Patent No.: US 11,600,240 B2
(45) Date of Patent: Mar. 7, 2023

(54) DISPLAY APPARATUS WITH PIXEL STRUCTURE ON GLASS SUBSTRATE AND GLASS SUBSTRATE

(71) Applicant: KYOCERA Corporation, Kyoto (JP)

(72) Inventors: Ryoichi Yokoyama, Kakogawa (JP); Takashi Shimizu, Kusatsu (JP)

(73) Assignee: KYOCERA Corporation, Kyoto (JP)

( * ) Notice: Subject to any disclaimer, the term of this patent is extended or adjusted under 35 U.S.C. 154(b) by 241 days.

(21) Appl. No.: 16/626,861

(22) PCT Filed: Feb. 26, 2019

(86) PCT No.: PCT/JP2019/007380
§ 371 (c)(1),
(2) Date: Dec. 26, 2019

(87) PCT Pub. No.: WO2019/167966
PCT Pub. Date: Sep. 6, 2019

(65) Prior Publication Data
US 2020/0135126 A1 Apr. 30, 2020

(30) Foreign Application Priority Data
Feb. 28, 2018 (JP) .............................. JP2018-036013

(51) Int. Cl.
*G09G 3/36* (2006.01)
*H01L 27/32* (2006.01)

(52) U.S. Cl.
CPC ....... *G09G 3/3648* (2013.01); *H01L 27/3262* (2013.01); *H01L 27/3276* (2013.01)

(58) Field of Classification Search
CPC .............. G09G 3/3648; H01L 27/3262; H01L 27/3276; H01L 25/167; H01L 25/0753; H01L 33/62; H01L 33/00; G09F 9/30; G09F 9/40
USPC .......................................................... 257/66
See application file for complete search history.

(56) References Cited

U.S. PATENT DOCUMENTS

| | | | |
|---|---|---|---|
| 2004/0201551 A1 | 10/2004 | Suzuki et al. | |
| 2015/0187807 A1* | 7/2015 | Tsuruoka | H01L 27/124 257/347 |
| 2017/0194505 A1 | 7/2017 | Cho et al. | |
| 2019/0103513 A1* | 4/2019 | Watanabe | H01L 33/62 |
| 2019/0197286 A1* | 6/2019 | Kim | H01L 27/3225 |
| 2019/0326367 A1* | 10/2019 | Jung | G06F 3/0412 |

FOREIGN PATENT DOCUMENTS

| | | |
|---|---|---|
| JP | 58-169174 A | 10/1983 |
| JP | 2001-075511 A | 3/2001 |

* cited by examiner

*Primary Examiner* — Thao X Le
*Assistant Examiner* — Laura M Dykes
(74) *Attorney, Agent, or Firm* — Volpe Koenig

(57) ABSTRACT

A display apparatus includes: a glass substrate; a light emitting device included in a pixel structure disposed on one principal surface of the glass substrate; an input electrode, disposed on the one principal surface, for inputting a driving signal to the light emitting device; and a back connection member disposed on the other principal surface of the glass substrate so as to be electrically connected to the input electrode. A back insulating layer is disposed on the other principal surface, and a top face of the back insulating layer is located above a top face of the back connection member.

12 Claims, 11 Drawing Sheets

_US 11,600,240 B2_

DISPLAY APPARATUS WITH PIXEL STRUCTURE ON GLASS SUBSTRATE AND GLASS SUBSTRATE

CROSS-REFERENCE TO RELATED APPLICATIONS

This application is a national stage entry according to 35 U.S.C. 371 of International Application No. PCT/JP2019/007380 filed on Feb. 26, 2019, which claims priority to Japanese Patent Application No. 2018-036013 filed on Feb. 28, 2018, the contents of which are entirely incorporated herein by reference.

TECHNICAL FIELD

The present disclosure relates to a display apparatus having a pixel structure such as an LED (Light Emitting Diode) disposed on one of glass substrate surfaces, and also relates to a glass substrate and a method of manufacturing a glass substrate.

BACKGROUND

There is a heretofore known backlight-free display apparatus of self-emitting type including a plurality of light emitting devices such as LEDs. An example of such a display apparatus from the prior art is described in Japanese Unexamined Patent Publication JP-A 2001-75511 (Patent Literature 1). This prior art display apparatus includes: a glass substrate; a scanning signal line arranged in a predetermined direction (row-wise, for example) on the glass substrate; a light emission-control signal line arranged in a direction perpendicular to the predetermined direction (column-wise, for example) in intersecting relation to the scanning signal line; an effective region composed of a plurality of pixel portions, each demarcated by the scanning signal line and the light emission-control signal line; and a plurality of light emitting devices disposed on an insulating layer.

The scanning signal line and the light emission-control signal line are connected to a back wiring line disposed on the back face of the glass substrate via a side wiring line disposed on the side face of the glass substrate. The back wiring line is connected to a driver device, such as IC or LSI, disposed on the back face of the glass substrate. That is, in the display apparatus, drive control for display is executed by the driver device disposed on the back face of the glass substrate. For example, the driver device is mounted on the back side of the glass substrate by means of COG (Chip On Glass) or otherwise.

SUMMARY

A display apparatus according to the disclosure includes: a glass substrate including principal surfaces and a side face; a pixel structure disposed on one principal surface of the principal surfaces of the glass substrate; an input electrode, disposed on the one principal surface, for inputting a driving signal to the pixel structure; a back connection member disposed on an other principal surface of the principal surfaces of the glass substrate so as to be electrically connected to the input electrode; and a first insulating layer disposed on the other principal surface, the first insulating layer including a top face located above a top face of the back connection member.

Moreover, a glass substrate according to the disclosure includes: a plurality of pixel structures disposed on one principal surface; an input electrode, disposed on the one principal surface, for inputting a driving signal to the plurality of pixel structures; a back connection member disposed on an other principal surface so as to be electrically connected to the input electrode; and a first insulating layer on the other principal surface, the first insulating layer lying over an effective region including the plurality of pixel structures, the first insulating layer including a top face located above a top face of the back connection member.

Moreover, a method of manufacturing a glass substrate having a one principal surface side and an other principal surface side according to the disclosure, includes forming an input electrode on the one principal surface side, the input electrode for inputting a driving signal to a pixel structure; forming a back connection member on the other principal surface side, the back connection member electrically connected to the input electrode; forming a back electrode on the other principal surface side, the back electrode constituting the back connection member; forming a side wiring line concurrently with forming the back connection member, the side wiring line for electrically connecting the input electrode and the back electrode; thereafter forming a first insulating layer on the other principal surface side; and locating a top face of the first insulating layer above a top face of the back connection member.

Moreover, a display apparatus according to the disclosure includes: a glass substrate including principal surfaces and a side face; a pixel structure disposed on one principal surface side of the principal surfaces of the glass substrate; a front connection member, including an input electrode, disposed on the one principal surface side, the input electrode for inputting a driving signal to the pixel structure; a back connection member disposed on an other principal surface side of the principal surfaces of the glass substrate, the back connection member electrically connected to the input electrode; a first insulating layer disposed on the other principal surface side, the first insulating layer including a top face located above a top face of the back connection member; and a pixel-structure placement member on the one principal surface side, the pixel-structure placement member lying between the pixel structure and the glass substrate, the pixel-structure placement member including a top face located above a top face of the front connection member.

DETAILED DESCRIPTION

Figure 1:
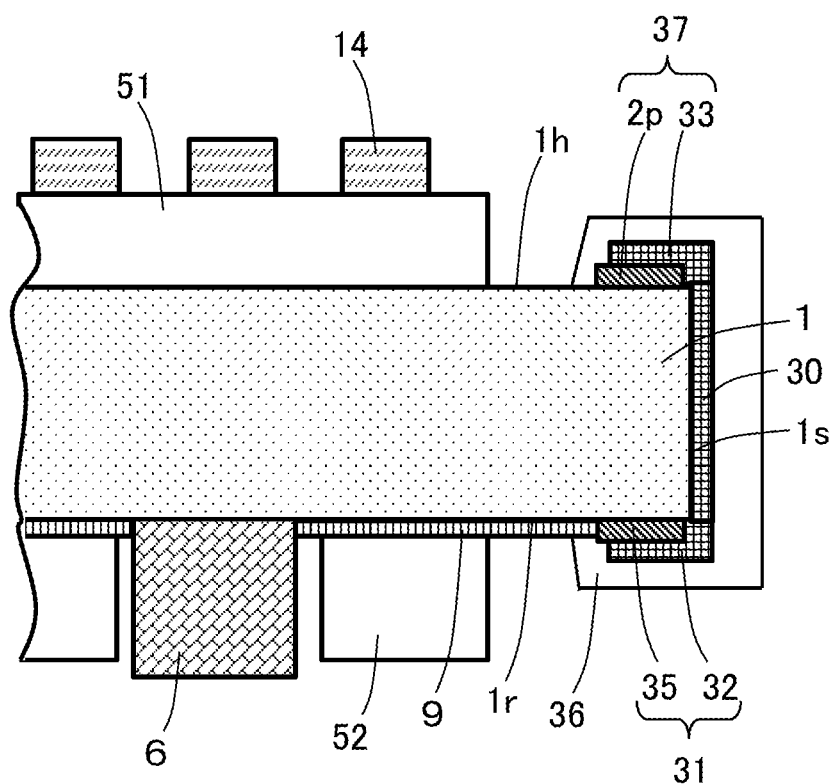
FIG. 1 is a fragmentary sectional view showing an embodiment of a display apparatus according to the disclosure.

Other and further objects, features, and advantages of the invention will be more explicit from the following detailed description taken with reference to the drawings.

Referring to FIGS. 6 to 11, a display apparatus underlying the display apparatus according to the disclosure will be described first. The display apparatus underlying the display apparatus according to the disclosure includes: a glass substrate 1; a scanning signal line 2 arranged in a predetermined direction (row-wise, for example) on the glass substrate 1; a light emission-control signal line 3 arranged in a direction perpendicular to the predetermined direction (column-wise, for example) in intersecting relation to the scanning signal line 2; an effective region 11 composed of a plurality of pixel portions (Pmn), each demarcated by the scanning signal line 2 and the light emission-control signal line 3; and a plurality of light emitting devices 14 disposed on an insulating layer.

The scanning signal line 2 and the light emission-control signal line 3 are connected to a back wiring line 9 disposed on the back face of the glass substrate 1 via a side wiring line 30 disposed on the side face of the glass substrate 1. The back wiring line 9 is connected to a driver device 6, such as IC or LSI, disposed on the back face of the glass substrate 1. That is, in the display apparatus, drive control for display is executed by the driver device 6 disposed on the back face of the glass substrate 1. For example, the driver device 6 is mounted on the back side of the glass substrate 1 by means of COG (Chip On Glass) or otherwise.

In each pixel portion 15 (Pmn), there is disposed a light emission-control portion 22 for control operation such as light emission control, non-light-emission control, and light intensity control in the light emitting device 14 (LDmn) lying within a light emission area (Lmn). The light emission-control portion 22 includes a TFT (Thin Film Transistor) 12 (shown in FIG. 8) which serves as a switching device for inputting a light emission signal to each light emitting device 14, and a TFT 13 (shown in FIG. 8) which serves as a driver device for carrying out current drive to the light emitting device 14 in response to a light emission signal, produced as an output of potential difference between a positive voltage (anode voltage of about 3 to 5 V) and a negative voltage (cathode voltage of about −3 to 0 V), responsive to the level (voltage) of a light emission-control signal (a signal which is transmitted through the light emission-control signal line 3).

On a connection line for connecting a gate electrode and a source electrode in the TFT 13, there is disposed a capacitive element which serves as a retention capacity that retains the voltage of the light emission-control signal inputted to the gate electrode of the TFT 13 over a certain period of time until initiation of succeeding rewriting operation (one-frame period).

The light emitting device 14 is electrically connected to the light emission-control portion 22, a positive voltage input line 16, and a negative voltage input line 17 via through conductors 23a and 23b, such as through holes, passing through an insulating layer 41 (shown in FIG. 7) disposed in the effective region 11. That is, the positive electrode of the light emitting device 14 is connected to the positive voltage input line 16 via the through conductor 23a and the light emission-control portion 22, and, the negative electrode of the light emitting device 14 is connected to the negative voltage input line 17 via the through conductor 23b.

Moreover, in the display apparatus as seen in a plan view, a fringe part 1g, which serves no display function, is located between the effective region 11 and the end of the glass substrate 1. There may be a case where a light emission-control signal line driving circuit, a scanning signal line driving circuit, etc. are disposed in this fringe part 1g. It is desired that the fringe part 1g have as small a width as possible. Moreover, in the case of cutting a plurality of glass substrates 1 from a single base substrate, to avoid that the light emission-control portion 22 will be seriously affected by cut lines, as shown in the block circuit diagram of FIG. 9, in the outermost pixel portion 15, it is advisable for the light emission-control portion 22 to be located closer to the medial part of the glass substrate 1 than the light emitting device 14 as seen in a plan view.

A sub-pixel portion for red light emission, a sub-pixel portion for green light emission, and a sub-pixel portion for blue light emission may be used to constitute the individual pixel portions 15. The sub-pixel portion for red light emission includes a red light-emitting device such as a red LED, the sub-pixel portion for green light emission includes a green light-emitting device such as a green LED, and the sub-pixel portion for blue light emission includes a blue light-emitting device such as a blue LED. For example, these sub-pixel portions are arranged row-wise or column-wise.

Figure 9:
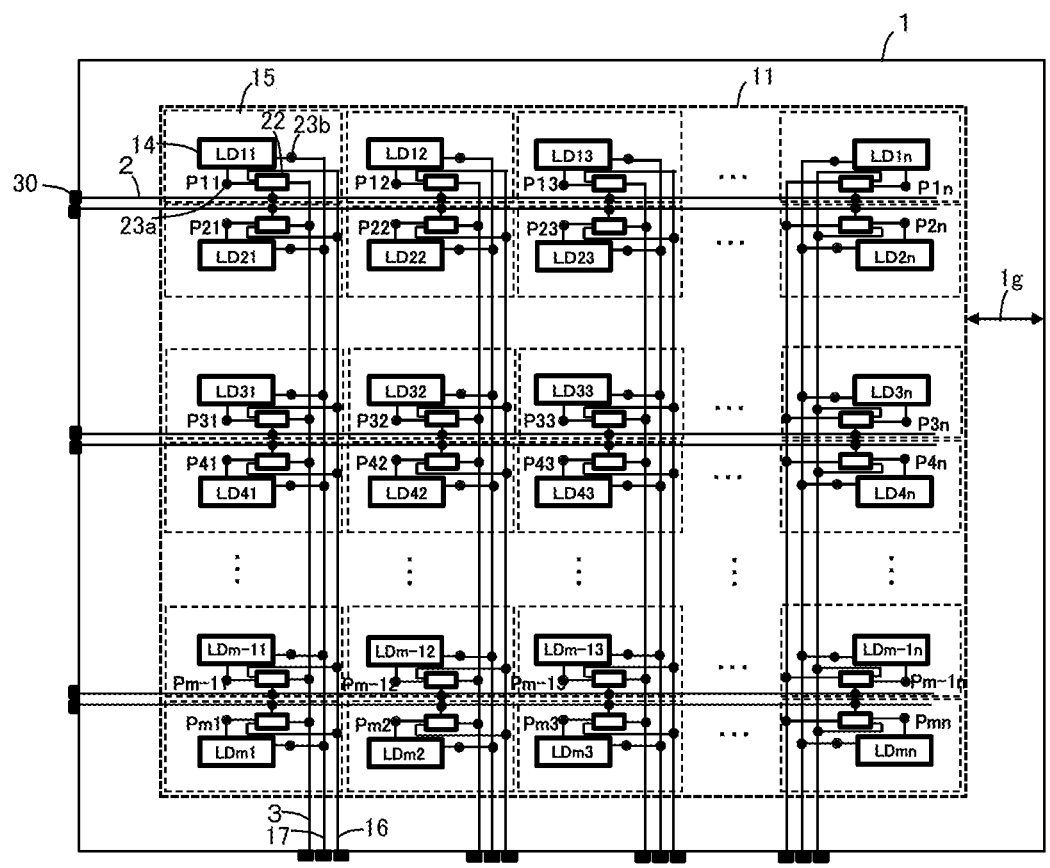
FIG. 9 is a block circuit diagram showing the basic configuration of another display apparatus underlying the display apparatus according to the disclosure.
Figure 10:
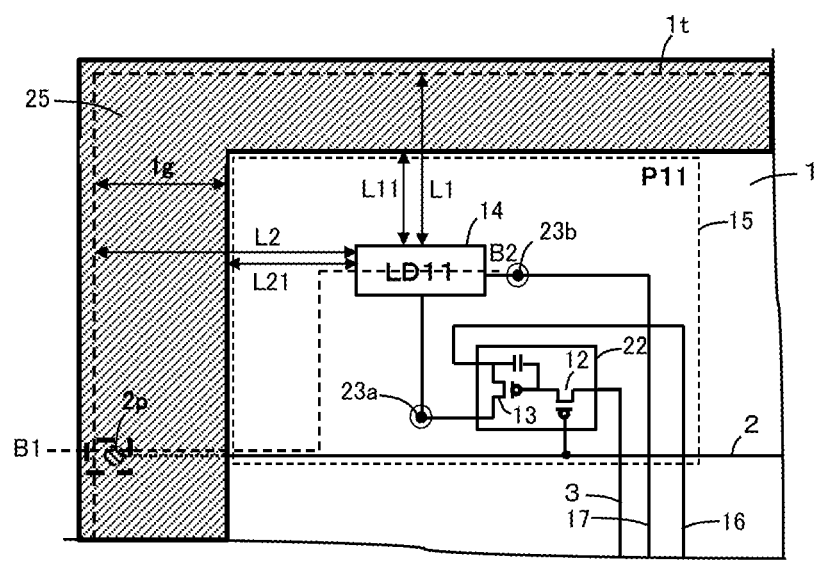
FIG. 10 is a circuit diagram of a single light emitting device and a light emission-control section connected to the light emitting device in the display apparatus shown in FIG. 9.
Figure 11:
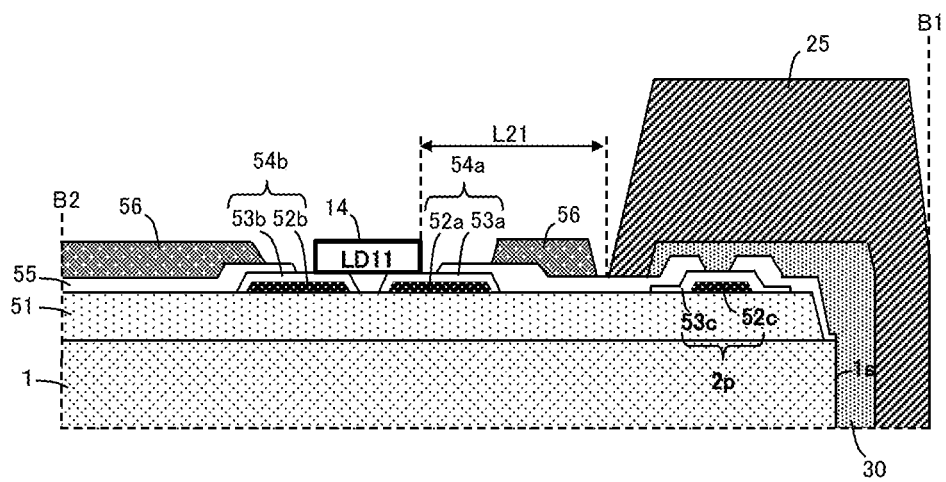
FIG. 11 is a sectional view of the display apparatus taken along the line B1-B2 of FIG. 10.

FIG. 10 is a fragmentary plan view showing the outermost pixel portion 15 (P11) in enlarged dimension in the display apparatus shown in FIG. 9, and, FIG. 11 is a sectional view taken along the line B1-B2 of FIG. 10. As shown in these drawings, in the display apparatus, to obscure the fringe part 1g which serves no display function, a light-blocking portion 25 made of a black matrix or the like is disposed at the fringe part 1g situated around the effective region 11.

As shown in FIG. 11, an insulating flattening layer 51 made of an acrylic resin or the like is disposed on the glass substrate 1, and, the light emitting device 14 is mounted on the insulating flattening layer 51. The light emitting device 14 is spaced away from the end of the glass substrate 1 by a distance of about 50 to 200 μm. That is, in FIG. 10, a spaced interval L1 between the light emitting device 14 and an end it of the glass substrate 1 is about 80 μm, and, a spaced interval L2 therebetween is about 150 μm.

The light emitting device 14 is mounted on the insulating flattening layer 51 for electrical connection with a positive electrode 54a and a negative electrode 54b placed on the insulating flattening layer 51 via an electrically conductive connection member such as solder. The positive electrode 54a may be composed of an electrode layer 52a in the form of, for example, a Mo—Al—Mo layered structure (made by successive laminations of an Al layer and a Mo layer on a Mo layer), and a transparent electrode 53a made of, for example, ITO (Indium Tin Oxide), for covering the electrode layer 52a. Likewise, the negative electrode 54b may be composed of, for example, an electrode layer 52b in the form of a Mo—Al—Mo layered structure and an ITO-made transparent electrode 53b that covers the electrode layer 52b.

On a part of the insulating flattening layer 51 which is located toward a side face 1s of the glass substrate 1 away from the positive electrode 54a and the negative electrode 54b, there is disposed an input electrode 2p including an electrode layer 52c and a transparent electrode 53c made of, for example, ITO, which covers the electrode layer 52c. The input electrode 2p is electrically connected to the positive electrode 54a, and functions as a relay electrode which is electrically connected to the back wiring line 9 via the side wiring line 30.

An insulating layer 55 made of, for example, silicon oxide ($SiO_2$) or silicon nitride ($SiN_x$) is disposed to cover the insulating flattening layer 51, part of each of the transparent electrodes 53a and 53b (a part thereof which does not overlap with the light emitting device 14), and the edge of the transparent electrode 53c. On the insulating layer 55, there is disposed a light-blocking layer 56 made of, for example, a black matrix formed in a position other than the installation position of the light emitting device 14 and the placement position of the light-blocking member 25. The light-blocking layer 56 may be provided for the purpose of rendering the areas except at the light emitting device 14 dark-colored background areas, such as black background areas, in the display apparatus as seen in a plan view.

There is disposed the side wiring line 30, mounted so as to extend from the position on the insulating layer 55 at which the input electrode 2p is covered as seen in a plan view, through the side face 1s of the glass substrate 1, to the back face of the glass substrate 1, for electrically connecting the input electrode 2p and the back wiring line 9. For example, the side wiring line 30 is formed by the application of an electrically conductive paste containing conductive particles such as silver particles, with the subsequent firing operation. The light-blocking member 25 is placed so as to cover the input electrode 2p and the side wiring line 30. The positive electrode of the light emitting device 14 is connected to the positive electrode 54a via a conductive connection member such as solder, and, the negative electrode of the light emitting device 14 is connected to the negative electrode 54b via a conductive connection member such as solder. Thus, the light emitting device 14 is mounted on the glass substrate 1.

The following describes embodiments of the display apparatus, the glass substrate, and the glass substrate manufacturing method according to the disclosure with reference to the drawings. Of structural components constituting the embodiment of the display apparatus according to the disclosure, only the main components are shown in each drawing to be hereafter referred to for the sake of explanation of the display apparatus according to the disclosure. Thus, the display apparatus according to the disclosure may be provided with other structural components, such as a circuit board, a wiring conductor, a control IC, LSI, etc., which are not shown. In FIGS. 1 to 5 showing the embodiment of the display apparatus according to the disclosure, the same reference numerals or alphanumerics have been used as in FIGS. 6 to 11 for similar components, and the detailed description of such components will be omitted.

FIGS. 1 to 5 are drawings showing various embodiments of the display apparatus according to the disclosure. As shown in these drawings, the display apparatus according to the disclosure includes: the glass substrate 1; the light emitting device 14 mounted on a front face 1h which is one principal surface of the principal surfaces of the glass substrate 1; the positive electrode and the negative electrode, which are not shown, disposed on the glass substrate 1, for electrically connecting the light emitting device 14; the input electrode 2p disposed on the end part of the glass substrate 1 so as to be electrically connected to the positive electrode and the negative electrode; the insulating flattening layer 51 formed, as a member for the placement of a pixel structure, between the light emitting device 14 and the front face 1h of the glass substrate 1; the side wiring line 30 formed on the side face 1s of the glass substrate 1; a back electrode 35 formed on a back face 1r which is the other principal surface of the principal surfaces of the glass substrate 1; a back cover wiring line 32 extending continuously from the side wiring line 30 so as to cover the back electrode 35; a front cover wiring line 33 extending from the side wiring line 30 so as to cover the input electrode 2p; an insulating overcoat layer 36 that covers the front cover wiring line 33, the back cover wiring line 32, and the side wiring line 30; a back insulating layer 52 formed at the back face 1r; and the driver device 6, such as IC or LSI, for the supply of driving signals to the light emitting device 14.

As the first insulating layer, the back insulating layer 52 is disposed on the other principal surface (back face 1r). The top face of the back insulating layer 52 is located above the top face of a back connection member 31. The back connection member 31 includes the back electrode 35 and the back cover wiring line 32. The insulating overcoat layer 36 serves as the second insulating layer.

In this embodiment, the top face of a given structural component refers to one of the faces of the component which is located farthest away from the principal surface of the glass substrate 1 where the component is placed. Thus, the height of a given structural component corresponds to the distance between the glass substrate 1's principal surface where the component is placed and the face of the component located farthest away from the principal surface.

The above-described construction affords the following advantageous effects. A signal from the driver device 6 such as IC disposed on the back face 1r, or equivalently the other principal surface of the glass substrate 1, can be fed to the light emitting device 14 on the front face 1h of the glass substrate 1 via the side wiring line 30 formed on the side face 1s of the glass substrate 1. Effective use of the area of the back face 1r helps reduce the dimensions of the fringe part 1g. With the reduced-size fringe part 1g, in the process of tiling a plurality of display apparatuses, the joints will be substantially invisible. This allows quite natural, aesthetically pleasant display to be achieved. Moreover, the side wiring line 30, the front cover wiring line 33, and the back cover wiring line 32 can be covered with the insulating overcoat layer 36. In this case, these wiring lines, and also the input electrode 2p and the back electrode 35 can be effectively covered for protection.

In the display apparatus according to the disclosure, as the light emitting device 14, it is possible to use any of devices of self-emitting type, such as a microchip light emitting diode (LED), a monolithic light emitting diode, an organic EL, an inorganic EL, and a semiconductor laser device.

The overcoat layer 36 is disposed for the purpose of obscuring the fringe part 1g, as well as for the purpose of protecting the side wiring line 30 disposed on the side face of the glass substrate 1. Thus, the overcoat layer 36 is preferably placed so as to extend over the fringe part 1g of the glass substrate 1. Under certain circumstances, the overcoat layer 36 may be placed in contact with the insulating flattening layer 51 disposed on the front face 1h of the glass substrate 1. The overcoat layer 36 may also be placed in contact with the back insulating layer 52 disposed at the back face 1r of the glass substrate 1. Moreover, the overcoat layer 36 is preferably made to have a light-blocking property. In this case, during manufacturing of large-sized combined display equipment, so-called multi-display equipment, by arranging (tiling) a plurality of glass substrates 1, each equipped with a plurality of light emitting devices 14, in a matrix on the same plane with their side faces joined together by an adhesive or other means, the light-blocking property of the overcoat layer 36 is useful to obscure the joints in the tiled arrangement.

The overcoat layer 36 has a dark color such as black, blackish brown, dark brown, dark blue, or dark purple for efficient absorption of visible light to yield a light blocking effect. For example, the overcoat layer 36 is configured as a light-blocking film formed of a transparent resin layer blended with dark-color pigments or dyes, or a seal member which is cemented, bonded, or otherwise set in place, or may also be configured as a frame member made of plastic or the like which is cemented, bonded, or otherwise set in place. This light-blocking overcoat layer 36 absorbs most of visible light to produce light blocking effect.

The overcoat layer 36 may be formed by applying and printing an uncured resin paste blended with dark-color pigments or dyes to the fringe part 1g on the glass substrate 1 by a coating technique, a mask-using printing technique, a roller printing technique, etc., and thereafter curing the paste coating by a thermal curing process, a light curing process using irradiation of light such as ultraviolet light, or a light and thermal curing process, for example.

The width of the overcoat layer 36 is substantially equal to the width of the fringe part 1g. Given that the fringe part 1g of smaller width, for example, the narrower fringe part 1g located on the upper side of the glass substrate 1 as seen in FIG. 10, has a width in a range of about 20 µm to 50 µm, then the overcoat layer 36 located at the narrower fringe part 1g has a width in a range of about 20 µm to 50 µm. On the other hand, given that the fringe part 1g of larger width, for example, the wider fringe part 1g located on the left-hand side of the glass substrate 1 as seen in FIG. 10, has a width in a range of about 100 µm to 200 µm, then the overcoat layer 36 located at the wider fringe part 1g has a width in a range of about 100 µm to 200 µm.

Figure 2:
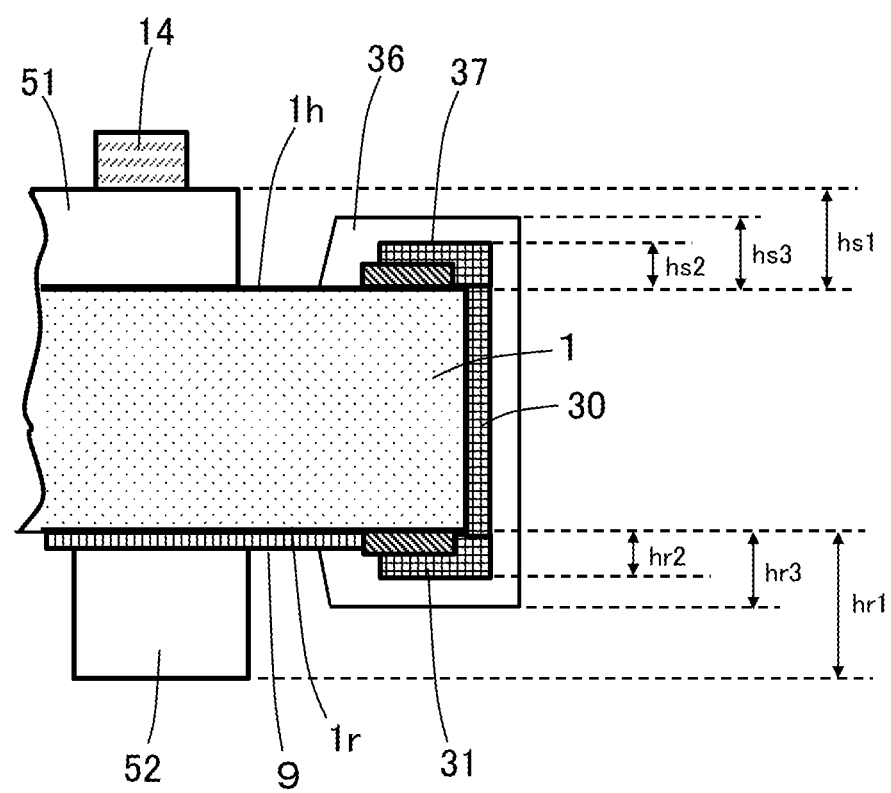
FIG. 2 is a conceptual fragmentary sectional view showing an end of the display apparatus shown in FIG. 1 and its surroundings.

Moreover, in the display apparatus according to the disclosure, a plurality of laminated layer components are disposed on the glass substrate 1, and, the height-wise position of each component is an important point to note. Referring to FIG. 2, with the front face 1h of the glass substrate 1 defined as a reference level, given that the height of the insulating flattening layer 51 (the level of its top) is hs1, the height of the front face 1h-side overcoat layer 36 (the level of its top face) is hs3, and the height of a front connection member 37 including the input electrode 2p and the front cover wiring line 33 (the level of its top face) is hs2, then the level hs3 of the top face of the front face 1h-side overcoat layer 36 is lower than the level hs1 of the top face of the insulating flattening layer 51, the level hs2 of the top face of the front connection member 37 is lower than the level hs1 of the top face of the insulating flattening layer 51 and the level hs3 of the top face of the front face 1h-side overcoat layer 36 as well. The fulfillment of such a height-wise relationship achieves effective prevention of the occurrence of a break and breakage in the front connection member 37. By definition, the level of the top face of each component corresponds to the maximum height of each component from the standpoint of prevention of breakage and damage.

Moreover, in the display apparatus according to the disclosure, the back insulating layer 52 is disposed on the back face 1r of the glass substrate 1. The back insulating layer 52 is preferably located in a position corresponding to the installation position of the light emitting device 14. That is, the back insulating layer 52 is preferably located in a position corresponding to the effective region 11. In this case, the insulating flattening layer 51 disposed on the front face 1h of the glass substrate 1 and the back insulating layer 52 disposed on the back face 1r of the glass substrate 1 become nearly equal in outside shape and in area as seen in a plan view, and thus the force exerted on one principal surface of the principal surfaces of the glass substrate 1 by the insulating flattening layer 51 and the force exerted on the other principal surface by the back insulating layer 52 become nearly equal in magnitude. This makes it possible to reduce the amount of warpage in the glass substrate 1 resulting from the difference in thermal expansion coefficient between the glass substrate 1 and each of these layers.

To attain the described objectives, preferably, the insulating flattening layer 51 and the back insulating layer 52 have the same thickness. More preferably, the insulating flattening layer 51 and the back insulating layer 52 are made of the same material. For example, both of the insulating flattening layer 51 and the back insulating layer 52 are made of an organic resin such as an acrylic resin or polycarbonate, or may be made of an inorganic material such as silicon oxide ($SiO_2$) or silicon nitride ($Si_3N_4$). Note that the back insulating layer 52 is not formed in the placement position of the driver device 6 for the supply of driving signals to the light emitting device 14 at the front face 1h of the glass substrate 1. For example, the back insulating layer 52 is made of a photosensitive resin. Under photolithography, a part of the resin which corresponds to the placement position of the driver device 6 is removed. Likewise, a part of the resin which corresponds to the fringe part 1g may be removed.

A part of the back face 1r of the glass substrate 1 which corresponds to the fringe part 1g is provided with the back electrode 35 which is electrically connected to the input electrode 2p on the front face 1h. Moreover, in this embodiment, the side face is of the glass substrate 1 is provided with the side wiring line 30 made of a silver paste, for example. Concurrently with the application of the coating of the side wiring line 30, the back face 1r of the glass substrate 1 is coated with the back cover wiring line 32 so that the back cover wiring line 32 can be disposed for connection on the top face of the back electrode 35, and, the front face 1h of the glass substrate 1 is coated with the front cover wiring line 33 so that the front cover wiring line 33 can be disposed for connection on the top face of the input electrode 2p. That is, the back connection member 31 including the back electrode 35 and the back cover wiring line 32 is formed so as to be electrically connected to the side wiring line 30, and, the front connection member 37 including the input electrode 2p and the front cover wiring line 33 is formed so as to be electrically connected to the side wiring line 30. Following the completion of formation of the back connection member 31, the overcoat layer 36 is disposed so as to cover the back connection member 31, the side wiring line 30, and the front connection member 37.

As is the case with the front face 1h of the glass substrate 1, the height-wise position of each of the layered components at the back face 1r of the glass substrate 1 is an important point to note. Referring to FIG. 2, with the back face 1r defined as a reference level, given that the height of the back connection member 31 (the level of its top face) is hr2, the height of the back face 1r-side overcoat layer 36 (the level of its top face) is hr3, and the height of the back insulating layer 52 (the level of its top face) is hr1, then the level hr2 of the top face of the back connection member 31 is lower than the level hr1 of the top face of the back insulating layer 52, and, the level hr3 of the top face of the back face 1r-side overcoat layer 36 that covers the back connection member 31 is lower than the level hr1 of the top face of the back insulating layer 52. The fulfillment of such a height-wise relationship makes these electrode and wiring components resistant to damage such as a break and breakage.

Figure 3:
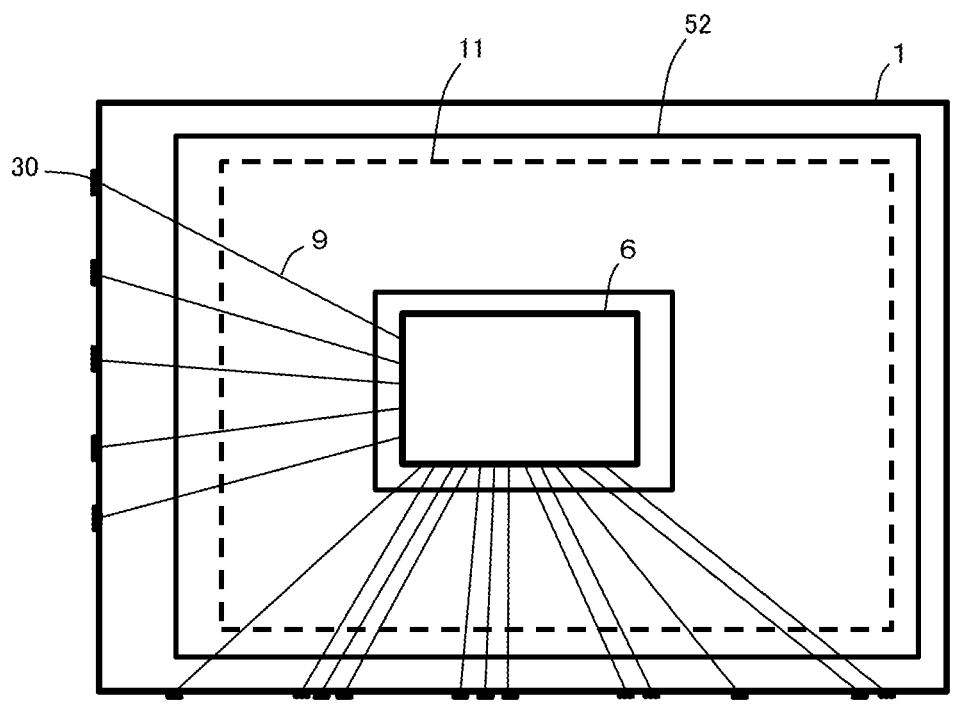
FIG. 3 is a bottom view of the display apparatus according to the disclosure.

FIG. 3 is a schematic back plan view showing the glass substrate 1 as seen from the back face 1r side. The range indicated by dashed lines corresponds to the effective region 11, within which an orderly arrangement of the plurality of light emitting devices 14 is disposed at the front face 1h. The back insulating layer 52 is disposed so as to cover the effective region 11 as seen in a plan view. The side wiring line 30 is formed on two sides of the rectangular glass substrate. The driver device 6 such as IC is located on a central portion of the back face 1r of the glass substrate 1. Moreover, on the back face 1r, the back wiring line 9 is formed to connect the side wiring line 30 and the driver device 6.

Moreover, the back insulating layer 52 is disposed so as to cover the back wiring line 9. The back insulating layer 52 is disposed over the entire area of the effective region 11 exclusive of the installation position of the driver device 6. That is, the large-area back insulating layer 52 including a high-level top face is provided, and therefore the back insulating layer 52 is stably contacted on its top face by a placement table or the like. This minimizes the chance that the placement table or the like may abut against the back connection member 31 including a low-level top face located on the side face is side of the glass substrate 1. Note that the glass substrate 1 includes wiring and electrode components on both principal surfaces in this embodiment, and thus there may be cases where the glass substrate 1 is conveyed with either one of its principal surfaces facing upward in the manufacturing process. In this regard, by forming the individual layers, electrodes, etc. in accordance with the height-wise relationship as specified in this embodiment, under conveyance or moving assembly line, the glass substrate 1 is less prone to conveyance-caused damage regardless of which one of its principal surfaces faces upward.

Figure 4:
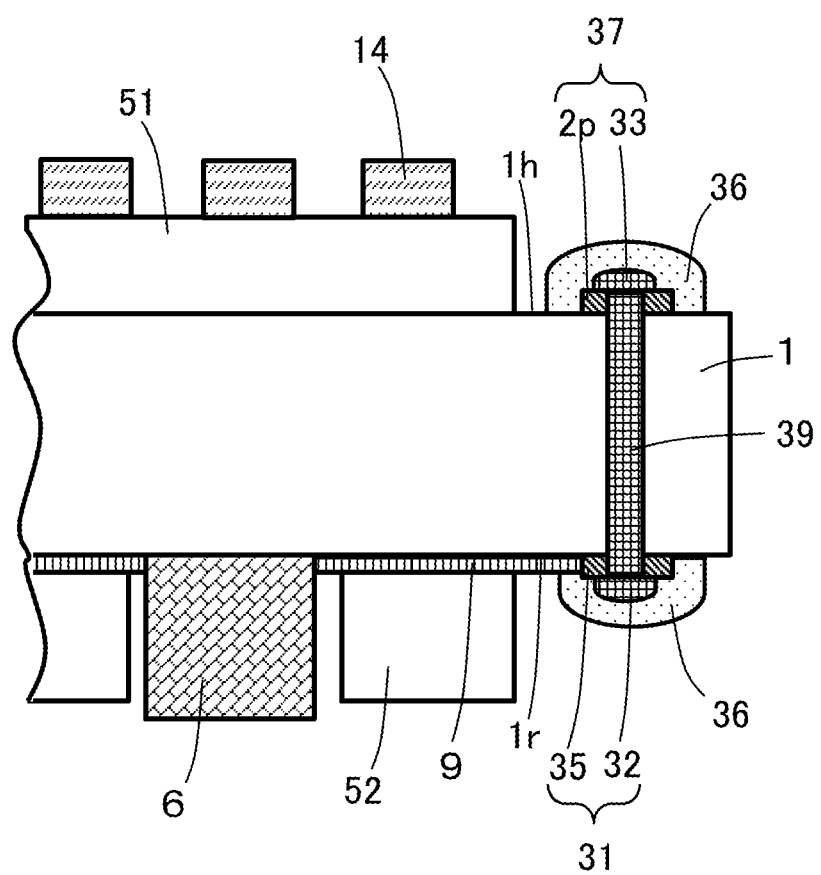
FIG. 4 is a fragmentary sectional view showing another embodiment of the display apparatus according to the disclosure.

FIG. 4 is a drawing of another embodiment, illustrating a glass substrate 1 provided with a through wiring line 39 instead of the side wiring line 30, and a display apparatus. The through wiring line 39 is formed by boring a hole all the way through the glass substrate 1 from the front face 1h to the back face 1r, and thereafter filling the through hole with a conductive material such as a metal along the inner wall of the through hole. The through wiring line 39 is formed in the fringe part 1g of the glass substrate 1. The back electrode 35 and the input electrode 2p are formed around the throughhole portion of the glass substrate 1. The through wiring line 39 is formed by means of metallic sputtering, molten solderusing soldering, or otherwise. Moreover, the back cover wiring line 32 is formed on the back face 1r to constitute the back connection member 31, and the front cover wiring line 33 is formed on the front face 1h to constitute the front connection member 37. The back connection member 31 and the front connection member 37 are each connected to the through wiring line 39. After that, the overcoat layer 36 is disposed so as to cover each of the back connection member 31 and the front connection member 37.

Also in this embodiment, the height-wise relationship among the layered components laminated on each principal surface of the glass substrate 1 is an important point to note. The top face of the back connection member 31 is located below the top face of the back insulating layer 52, and, the top face of the back face 1r-side overcoat layer 36 that covers the back connection member 31 is located below the top face of the back insulating layer 52. Moreover, the top face of the front connection member 37 is located below the top face of the insulating flattening layer 51, and, the top face of the front face 1h-side overcoat layer 36 covering the front connection member 37 is located below the top face of the insulating flattening layer 51.

Figure 5:
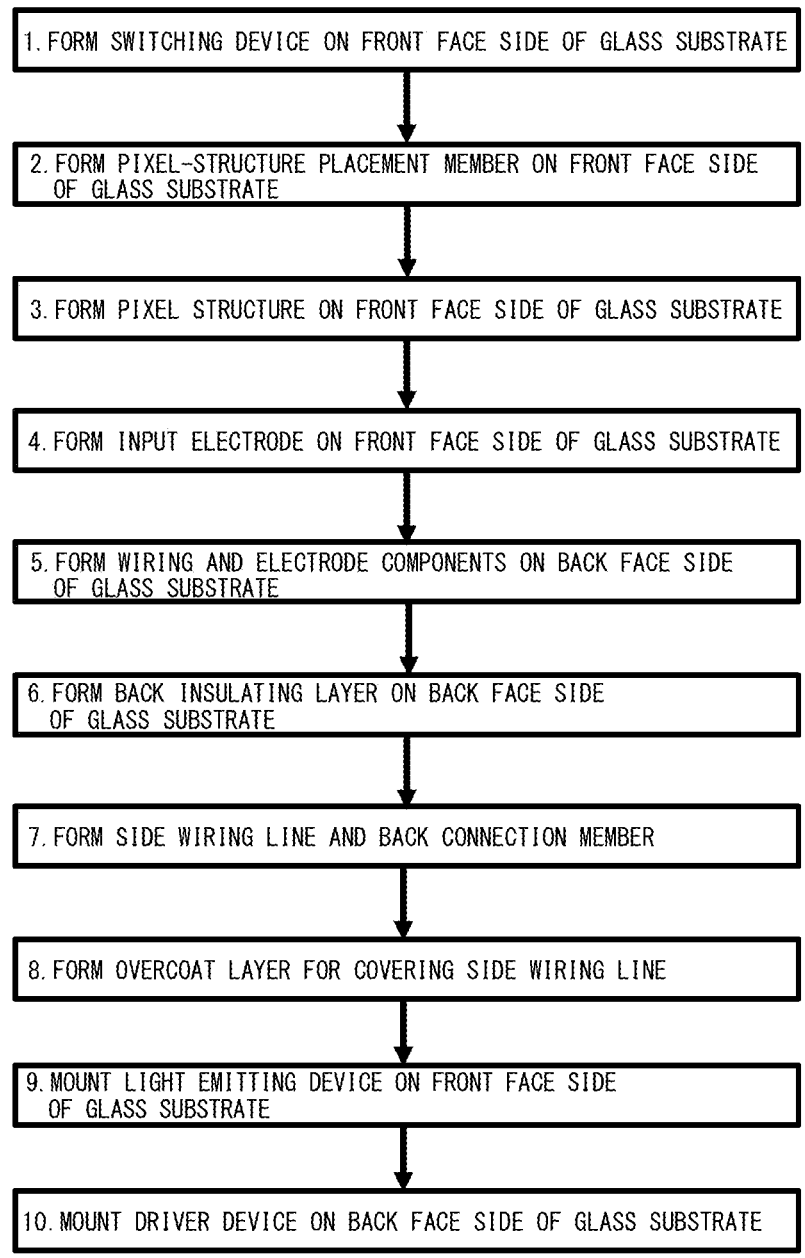
FIG. 5 is a flow chart showing a procedure in the making of the glass substrate according to the disclosure.
Figure 6:
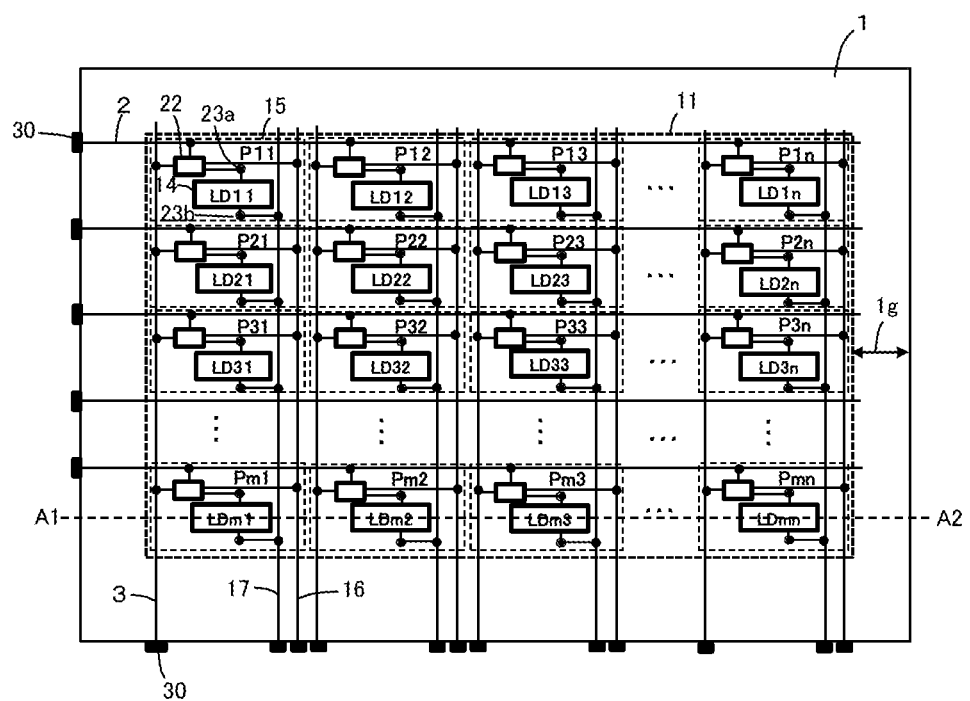
FIG. 6 is a block circuit diagram showing the basic configuration of a display apparatus underlying the display apparatus according to the disclosure.
Figure 7:
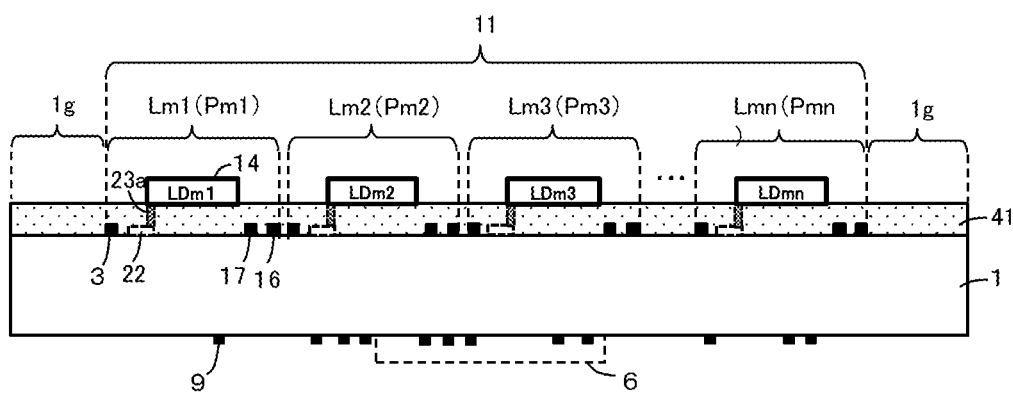
FIG. 7 is a sectional view of the display apparatus taken along the line A1-A2 of FIG. 6.
Figure 8:
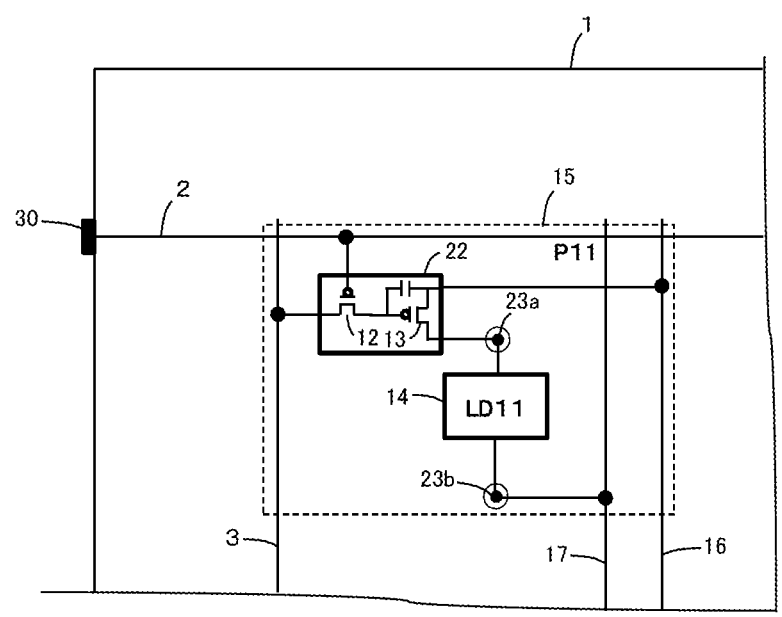
FIG. 8 is a circuit diagram of a single light emitting device and a light emission-control section connected to the light emitting device in the display apparatus shown in FIG. 6.

FIG. 5 is a flow chart for an embodiment of the glass substrate manufacturing method, showing procedural steps in the making of the glass substrate 1. In Step 1, on the front face 1h side of the glass substrate 1, the switching devices 12 and 13 are constructed from TFTs or other for the supply of driving signals to the light emitting device 14. A thin-film forming technique such as CVD (Chemical Vapor Deposition) can be adopted for the formation of the switching devices. Subsequently, in Step 2, the insulating flattening layer 51 is formed as a pixel-structure placement member on the front face 1h side of the glass substrate 1. For example, the insulating flattening layer 51 is made of a photosensitive resin with a layer thickness in a range of 2 μm to 5 μm. Moreover, the insulating flattening layer 51 is partly removed on an as needed basis.

In Step 3, a positive electrode, a negative electrode, etc. for the installation of the light emitting device 14 are formed to constitute a front face-side pixel structure. In this embodiment, the pixel structure includes one or more unitary pixel portions, each including the light emitting device 14, the positive electrode and the negative electrode connected to the light emitting device 14, the switching devices 12 and 13 formed of TFTs or other electrically connected to the aforementioned electrodes, etc. Although a LED display exemplifies the display apparatus in this embodiment, the display apparatus may be built as a liquid crystal display. In this case, a pixel electrode constituting part of a picture element serves as the front face-side pixel structure. The liquid crystal display apparatus is constructed of a stack of an array substrate provided with a plurality of pixel electrodes and a counter substrate provided with a color filter, etc.

Next, in Step 4, the input electrode 2p is formed on the fringe part 1g of the glass substrate 1. The input electrode 2p may either be formed concurrently with the formation of the positive electrode and the negative electrode for the installation of the light emitting device 14 or be formed independently in a separate step. The input electrode 2p can also be formed by a thin-film forming technique such as CVD. After that, in Step 5, wiring and electrode components are formed on the back face 1r side of the glass substrate 1. In forming these wiring and electrode components on the back face 1r side, the glass substrate 1 is set with its front face 1h side placed on the mounting surface of the placement table. At this time, with the insulating flattening layer 51 which is greater in thickness than the front connection member 37, expressed differently, with the insulating flattening layer 51 designed so that the level hs1 of its top face is higher than the level hs2 of the top face of the front connection member 37, the abutting contact of the front face 1h of the glass substrate 1 with the mounting surface of the placement table causes no damage to the input electrode 2p formed at the fringe part 1g.

On the back face 1r side of the glass substrate 1, the back wiring line 9 and the back electrode 35 are formed. The back wiring line 9 and the back electrode 35 are each made with a predetermined shape from, for example, an ITO (Indium Tin Oxide) transparent conductive film by photolithography. Next, in Step 6, the back insulating layer 52 is formed from a photosensitive resin. A part of the back insulating layer 52 which corresponds to the installation position of the driver device 6, as well as a part thereof which corresponds to the fringe part 1g, is removed by photolithography. It is preferable that the back insulating layer 52 has a thickness (height hr1) in a range of 2 μm to 7 μm. The placement of a back insulating layer 52 having a thickness of less than 2 μm has attendant difficulties in protecting the back connection member 31 formed at the fringe part 1g against a break and breakage. On the other hand, the placement of a back insulating layer 52 having a thickness exceeding 7 μm raises the possibility of cracking in the back insulating layer 52 in itself. Note that the back insulating layer 52 may be given a multilayer structure consisting of a stack of a plurality of resin-made insulating layers.

After that, the back insulating layer 52 on the back face 1r side is determined as an abutting face of the glass substrate 1 that abuts on the mounting surface of the placement table. At this time, with the back insulating layer 52 which is greater in thickness than the back electrode 31 formed on the fringe part 1g, the back electrode 31 is less likely to suffer from damage. Then, in Step 7, the side wiring line 30 is formed on the side face is of the glass substrate 1. The side wiring line 30 may be formed by any of a relief-printing technique, an offset printing technique, and a dispenser-coating technique. Concurrently with the formation of the side wiring line 30, the front cover wiring line 33 and the back cover wiring line 32 are formed from the same material in a manner such that the front cover wiring line 33 extends over the input electrode 2p on the front face 1h side, whereas the back cover wiring line 32 extends over the back electrode 35 on the back face 1r side. Thus, the input electrode 2p and the front cover wiring line 33 constitute the front connection member 37, and, the back electrode 35 and the back cover wiring line 32 constitute the back connection member 31. At this time, it is important to make the front connection member 37 thinner than the front face 1h-side insulating flattening layer 51, as well as to make the back connection member 31 thinner than the back face 1r-side back insulating layer 52.

Next, in Step 8, a coating of the overcoat layer 36 is applied so as to cover the side wiring line 30. While the overcoat layer 36 can be formed by means of printing, dipping, or otherwise, in the interest of strict control of a coating amount and a coating thickness, for example, an ink-jet technique or a dispensing technique is desirable for use. The overcoat layer 36 is formed so as to cover not only the side wiring line 30 but also the back connection member 31 and the front connection member 37. At this time, under the condition where the placement table is contacted on its mounting surface by the thick back insulating layer 52, the back face 1r-side overcoat layer 36 no longer abuts against the placement table. This allows smooth coating operation to be achieved. Moreover, the thickness of each of the front face 1h-side overcoat layer 36 and the back face 1r-side overcoat layer 36 is also an important point to note. The front face 1h-side overcoat layer 36 is made smaller in thickness than the insulating flattening layer 51, and, the back face 1r-side overcoat layer 36 is made smaller in thickness than the back insulating layer 52.

Moreover, the overcoat layer 36 is preferably made of a lightproof insulating material. In this case, the light-blocking overcoat layer 36 is black-colored or navy blue-colored, for example. Moreover, a part of the overcoat layer 36 which extends over the front face 1h and the back face 1r of the glass substrate 1 is preferably formed so as to extend over the entire area of the fringe part 1g.

After that, in Step 9, the plurality of light emitting devices 14 are orderly arranged on the insulating flattening layer 51 on the front face 1h side of the glass substrate 1, and, each light emitting device 14 is connected to the positive electrode and the negative electrode. During this connecting operation, the plurality of light emitting devices 14 are subjected to a pressure force of predetermined level exerted from the front face 1h of the glass substrate 1 by a pressing plate or the like. At this time, the back face 1r-side back insulating layer 52 formed over substantially the entire area of the effective region 11 permits even distribution of the pressure force. This eliminates the occurrence of localized application of pressure force to the glass substrate 1. It is noteworthy that the back insulating layer 52 is greater in thickness than other constituent components, and thus no pressure force will act upon the other constituent components.

Lastly, in Step 10, the driver device 6 is mounted on the back face 1r side of the glass substrate 1, whereupon the light emitting device 14-equipped glass substrate 1 is produced. The level of the top face of the driver device 6 may be lower than or equal to the level of the top face of the back insulating layer 52. In this case, during the conveyance of the thereby produced glass substrate 1 or the display apparatus, the driver device 6 can be protected from breakage and troubles resulting from its contact with other member such as a casing or a frame body or other device, as well as from a failure caused by static electricity. On the other hand, where the level of the top face of the driver device 6 is higher than or equal to the level of the top face of the back insulating layer 52, or particularly where the top face of the driver device 6 is located above the top face of the back insulating layer 52, it is advisable to provide a protective resin layer, a protective film, or the like to cover the driver device 6 for protection. The protective resin layer, as well as the protective film, may be made to have an insulation property. This protects the driver device 6 from the influence of static electricity. Moreover, the protective resin layer and the protective film may be made in the form of a member consisting of an insulating resin layer and a conductive resin layer laminated thereon and a member consisting of an insulating film and a conductive film laminated thereon, respectively. In this case, electromagnetic shielding capability can be attained. Moreover, the protective resin layer, as well as the protective film, may be made to have a light-transmittable property. This permits visual examination of the condition of the driver device 6 from the outside.

The back insulating layer 52 may be shaped in a film. In the filmy back insulating layer 52, its thickness can be easily adjusted to above the thickness of the resin layer-made back insulating layer 52 obtained by a coating technique or other means. This permits more effective protection for the back connection member 31 disposed on the end part of the back face 1r of the glass substrate 1. Where the display apparatus according to this embodiment is built as a liquid crystal display apparatus, the back insulating layer 52 may be made to have the functions of a polarizing film and a phase difference film. On the other hand, where the display apparatus according to this embodiment is built as a self-emitting display apparatus, the back insulating layer 52 is not required to have transparency, and thus it may be made as a colored film.

The insulating flattening layer 51 and the back insulating layer 52, which will probably be brought into contact with an external instrument such as the placement table, may include their top faces made as smooth surfaces. In this case, the top face of the insulating flattening layer 51 and the top face of the back insulating layer 52 are less prone to damage when making contact with the external instrument. The smooth surface is made as a plane which preferably has an arithmetical mean roughness of about 50 μm or less, or more preferably has an arithmetical mean roughness of about 10 μm or less.

Moreover, in the insulating flattening layer 51 and the back insulating layer 52 that will probably be brought into contact with an external instrument such as the placement table, for enhancement in their hardness, many insulating fine hard particles made of alumina ceramics, etc. may be contained. The insulating fine hard particles may be dark-colored, for example, black-colored or blackish brown-colored. This makes it possible to impart a dark-color background to the effective region 11 which serves as the display section of the display apparatus, and thereby improve the quality of display. In addition, the connection of the insulating flattening layer 51 and the back insulating layer 52 with the light-blocking overcoat layer 36 helps obscure the fringe part 1g and nearby areas.

The display apparatus according to the disclosure is not limited to the embodiments thus far described, and thus appropriate modifications and improvements may be made therein. For example, the glass substrate 1 may either be a transparent glass substrate or be an opaque substrate. When formed as an opaque substrate, the glass substrate 1 may be constructed of any of a colored glass substrate, a ground glass-made glass substrate, a glass-ceramic composite substrate, and a glass-metal composite substrate.

The invention may be carried into effect in the following forms.

In the display apparatus according to the disclosure, the back connection member may be covered with the second insulating layer, and, the top face of the second insulating layer may be located below the top face of the first insulating layer.

Moreover, in the display apparatus according to the disclosure, the first insulating layer may be located in a position corresponding to a placement position of the pixel structure.

Moreover, in the display apparatus according to the disclosure, a driver device for the supply of driving signals may be placed on the other principal surface, and, the top face of a back wiring line for connecting the driver device and the back connection member may be located below the top face of the first insulating layer.

Moreover, in the display apparatus according to the disclosure, a side wiring line may be disposed on the side face of the glass substrate and may serve as a wiring line for connecting the input electrode and the back connection member.

Moreover, in the display apparatus according to the disclosure, the back connection member may be made of a material of the side wiring line formed on the glass substrate, which material is a material for forming a back electrode.

In the glass substrate according to the disclosure, the back connection member may be covered with the second insulating layer, and, the top face of the first insulating layer may be located above the top face of the second insulating layer.

Moreover, in the glass substrate according to the disclosure, a driver device for driving the pixel structure may be disposed on the other principal surface, and, the driver device may be located in a position other than the placement position of the first insulating layer.

Moreover, in the glass substrate according to the disclosure, the side wiring line may be disposed on the side face contiguous to the two principal surfaces and may serve as a wiring line for connecting the input electrode and the back connection member.

In the glass substrate manufacturing method according to the disclosure, after forming the back connection member, a second insulating layer for covering the back connection member may be formed, and, the top face of the second insulating layer may be located below the top face of the first insulating layer.

Moreover, in the glass substrate manufacturing method according to the disclosure, after forming the first insulating layer, a driver device for driving the pixel structure may be mounted in a position at which the first insulating layer on the other principal surface is not formed.

In the display apparatus according to the disclosure, the back connection member and the front connection member may be covered with the second insulating layer, and, the top face of the other principal surface-side second insulating layer may be located below the top face of the first insulating layer, and also, the top face of the one principal surface-side second insulating layer may be located below the top face of the pixel-structure placement member.

According to the disclosure, a display apparatus includes: a glass substrate including principal surfaces and a side face; a pixel structure (light emitting device, for example) disposed on one principal surface of the principal surfaces of the glass substrate; an input electrode, disposed on the one principal surface, for inputting a driving signal to the pixel structure; and a back connection member disposed on the other principal surface of the glass substrate so as to be electrically connected to the input electrode, wherein a first insulating layer is disposed on the other principal surface, and, the top face of the first insulating layer is located above the top face of the back connection member. This affords the following advantageous effect. That is, the back connection member is lower in height than the first insulating layer formed on the back face, and can thus be protected from a break and breakage.

Moreover, in the display apparatus according to the disclosure, the back connection member is covered with a second insulating layer, and, the top face of the second insulating layer is located below the top face of the first insulating layer, with consequent protection also for the second insulating layer covering the back connection member. This permits more effective protection for the back connection member.

Moreover, in the display apparatus according to the disclosure, the first insulating layer is located in a position corresponding to the placement position of the pixel structure. This makes it possible to form the first insulating layer as a large-area layer, and thereby provide protection for the glass substrate with greater stability, with consequent more effective prevention of occurrence of a break and breakage in the back connection member.

According to the disclosure, a method of manufacturing a glass substrate including an input electrode, for inputting a driving signal to a pixel structure, formed on one principal surface side; a back connection member, which is electrically connected to the input electrode, formed on the other principal surface side, includes forming a back electrode constituting the back connection member, the other principal surface; thereafter forming a first insulating layer on the other principal surface side; after thereafter forming a side wiring line for electrically connecting the input electrode and the back electrode; forming the back connection member concurrently with forming the side wiring line; and locating the top face of the first insulating layer above the top face of the back connection member. Thus, the following advantageous effect can be obtained. That is, prior to the formation of the back connection member, the first insulating layer, which is greater in height than the back connection member, is formed on the other principal surface side, viz., the back face side of the glass substrate. This permits effective protection of the back connection member from a break and breakage during the formation of the back connection member and subsequent manufacturing process steps.

According to the disclosure, a display apparatus includes: a glass substrate including principal surfaces and a side face; a pixel structure disposed on one principal surface side of the principal surfaces of the glass substrate; an input electrode, disposed on the one principal surface side, for inputting a driving signal to the pixel structure; and a back connection member disposed on the other principal surface side of the glass substrate so as to be electrically connected to the input electrode, wherein a first insulating layer is disposed on the other principal surface side, and, the top face of the first insulating layer is located above the top face of the back connection member, on the one principal surface side, a pixel-structure placement member is disposed between the pixel structure and the glass substrate, and, a front connection member is disposed on the input electrode, and the top face of the pixel-structure placement member is located above the top face of the front connection member. Thus, the following advantageous effect can be obtained. That is, the level of the top face of the back connection member is lower than the level of the insulating layer formed on the principal surface side of the glass substrate provided with the back connection member, and, the level of the top face of the front connection member is lower than the level of the insulating layer formed on the principal surface side of the glass substrate provided with the front connection member. This permits protection of the back connection member and the front connection member from a break and breakage.

Moreover, in the display apparatus according to the disclosure, the back connection member and the front connection member are covered with the second insulating layer, and, the top face of the other principal surface-side second insulating layer is located below the top face of the first insulating layer, and the top face of the one principal surface-side second insulating layer is located below the top face of the pixel-structure placement member. Thus, the top face of the back connection member-covering second insulating layer and the top face of the front connection member-covering second insulating layer are located below the top face of the first insulating layer and below the top face of the pixel-structure placement member, respectively. This permits more effective protection of the back connection member and the front connection member from a break and breakage.

INDUSTRIAL APPLICABILITY

The display apparatus according to the disclosure may be built as a self-emitting display apparatus such as a LED display or an organic EL display, or a transmission type display apparatus such as a liquid crystal display. Moreover, the display apparatus according to the disclosure is applicable to various types of electronic equipment. Examples of electronic equipment to which the display apparatus is applicable include a large-size combined display apparatus (multi-display), an automotive route guidance system (car navigation system), a route guidance system for boats and ships, an aircraft route guidance system, a smartphone terminal, a mobile phone, a tablet terminal, a personal digital assistant (PDA), a video camera, a digital still camera, an electronic notepad, an electronic book, an electronic dictionary, a personal computer, a copier, a video-game machine terminal, a television set, a product indication tag, a price indication tag, an industrial programmable display apparatus, car audio equipment, a digital audio player, a facsimile, a printer, an automated teller machine (ATM), a vending machine, a head-mounted display (HMD), a digital wristwatch, and a smartwatch.

The disclosure may be embodied in other specific forms without departing from the spirit or essential characteristics thereof. The present embodiments are therefore to be considered in all respects as illustrative and not restrictive, the scope of the disclosure being indicated by the appended claims rather than by the foregoing description and all changes which come within the meaning and the range of equivalency of the claims are therefore intended to be embraced therein.

REFERENCE SIGNS LIST

1: Glass substrate
1$h$: Front face of glass substrate (one principal surface)
1$r$: Back face of glass substrate (other principal surface)
1$s$: Side face of glass substrate
2$p$: Input electrode
6: Driver device
14: Light emitting device
30: Side wiring line
31: Back connection member
35: Back electrode
36: Overcoat layer
37: Front connection member
51: Insulating flattening layer
52: Back insulating layer

The invention claimed is:
1. A display apparatus, comprising:
a glass substrate comprising principal surfaces and a side face;
a pixel structure disposed on one principal surface of the principal surfaces of the glass substrate;
an input electrode, disposed on the one principal surface, for inputting a driving signal to the pixel structure;
a back connection member disposed on an other principal surface of the principal surfaces of the glass substrate so as to be electrically connected to the input electrode;
a first insulating layer disposed on the other principal surface, the first insulating layer having a recess and comprising a top face located above a top face of the back connection member;
a pixel-structure placement member on the one principal surface side, the pixel-structure placement member lying between the pixel structure and the glass substrate, a height of a top face of the pixel structure placement member from the one principal surface being smaller than a height of the top face of the first insulating layer from the other principal surface; and
a driver device that generates the driving signal, the driver device being located in the recess without contacting the first insulating layer, the driver device comprising a top face located above the top face of the first insulating layer.
2. The display apparatus according to claim 1, wherein the back connection member is covered with a second insulating layer, and a top face of the second insulating layer is located below the top face of the first insulating layer.

3. The display apparatus according to claim 1, wherein the first insulating layer is located in a position corresponding to a placement position of the pixel structure.

4. The display apparatus according to claim 1, wherein the driver device is disposed on the other principal surface, and
a top face of a back wiring line for connecting the driver device and the back connection member is located below the top face of the first insulating layer.

5. The display apparatus according to claim 1, wherein a side wiring line is disposed on a side face of the glass substrate, and
the side wiring line connects the input electrode and the back connection member.

6. The display apparatus according to claim 5, wherein the back connection member comprises a back electrode and a back cover wiring line, and
the back cover wiring line comprises a material of the side wiring line.

7. A glass substrate, comprising:
a plurality of pixel structures disposed on one principal surface;
an input electrode, disposed on the one principal surface, for inputting a driving signal to the plurality of pixel structures;
a back connection member disposed on an other principal surface so as to be electrically connected to the input electrode;
a first insulating layer on the other principal surface, the first insulating layer lying over an effective region comprising the plurality of pixel structures, the first insulating layer having a recess and comprising a top face located above a top face of the back connection member;
a pixel-structure placement member on the one principal surface side, the pixel-structure placement member lying between the pixel structure and the glass substrate, a height of a top face of the pixel structure placement member from the one principal surface being smaller than a height of the top face of the first insulating layer from the other principal surface; and
a driver device that generates the driving signal, the driver device being located in the recess without contacting the first insulating layer, the driver device comprising a top face located above the top face of the first insulating layer.

8. The glass substrate according to claim 7, wherein the back connection member is covered with a second insulating layer, and
the top face of the first insulating layer is located above a top face of the second insulating layer.

9. The glass substrate according to claim 7, wherein the driver device is directly disposed on the other principal surface.

10. The glass substrate according to claim 7, wherein a side wiring line is disposed on a side face contiguous to the one principal surface and the other principal surface, and
the side wiring line connects the input electrode and the back connection member.

11. A display apparatus, comprising:
a glass substrate comprising principal surfaces and a side face;
a pixel structure disposed on one principal surface side of the principal surfaces of the glass substrate;
a front connection member, comprising an input electrode, disposed on the one principal surface side, the input electrode for inputting a driving signal to the pixel structure;
a back connection member disposed on an other principal surface side of the principal surfaces of the glass substrate, the back connection member electrically connected to the input electrode;
a first insulating layer disposed on the other principal surface side, the first insulating layer having a recess and comprising a top face located above a top face of the back connection member;
a pixel-structure placement member on the one principal surface side, the pixel-structure placement member lying between the pixel structure and the glass substrate, the pixel-structure placement member comprising a top face located above a top face of the front connection member, a height of a top face of the pixel structure placement member from the one principal surface being smaller than a height of the top face of the first insulating layer from the other principal surface; and
a driver device that generates the driving signal, the driver device being located in the recess without contacting the first insulating layer, the driver device comprising a top face located above the top face of the first insulating layer.

12. The display apparatus according to claim 11, wherein the back connection member and the front connection member are covered with a second insulating layer,
a top face of the second insulating layer, on the other principal surface side, is located below the top face of the first insulating layer, and
a top face of the second insulating layer, on the one principal surface side, is located below the top face of the pixel-structure placement member.

* * * * *